(12) United States Patent
Paczkowski

(10) Patent No.: US 6,674,869 B2
(45) Date of Patent: Jan. 6, 2004

(54) HEARING-AID ASSEMBLY USING FOLDED FLEX CIRCUITS

(75) Inventor: Theodore T. Paczkowski, Chaska, MN (US)

(73) Assignee: Hei, Inc., Victoria, MN (US)

( * ) Notice: Subject to any disclaimer, the term of this patent is extended or adjusted under 35 U.S.C. 154(b) by 111 days.

(21) Appl. No.: 09/792,700

(22) Filed: Feb. 23, 2001

(65) Prior Publication Data

US 2001/0038703 A1 Nov. 8, 2001

Related U.S. Application Data

(60) Provisional application No. 60/184,237, filed on Feb. 23, 2000.

(51) Int. Cl.[7] .............................................. H04R 25/00
(52) U.S. Cl. ......................... 381/324; 381/322; 381/328
(58) Field of Search ................................. 381/322, 324, 381/327, 328, 330, FOR 135; 174/254, 255, 256; 361/749, 750, 751; 439/67, 492, 493

(56) References Cited

U.S. PATENT DOCUMENTS

| | | | |
|---|---|---|---|
| 4,342,883 A | 8/1982 | Wernet et al. ............... 361/749 |
| 4,858,071 A | 8/1989 | Manabe et al. ............. 361/749 |
| 4,870,688 A | 9/1989 | Voroba et al. ................. 381/60 |
| 4,890,329 A | * 12/1989 | Erbe ........................... 381/324 |
| 4,997,377 A | 3/1991 | Goto et al. .................... 439/67 |
| 5,168,430 A | 12/1992 | Nitsch et al. ................ 361/749 |
| 5,448,511 A | 9/1995 | Paurus et al. .................. 365/52 |
| 5,646,446 A | 7/1997 | Nicewarner, Jr. et al. ... 257/723 |
| 5,789,815 A | 8/1998 | Tessier et al. ............... 361/749 |
| 5,821,614 A | 10/1998 | Hashimoto et al. ......... 361/749 |
| 6,014,320 A | 1/2000 | Mahon et al. ............... 361/803 |
| 6,121,676 A | 9/2000 | Solberg ....................... 257/686 |
| 6,133,626 A | 10/2000 | Hawke et al. ............... 257/686 |
| 6,144,749 A | 11/2000 | Fideler ........................ 381/323 |
| 6,157,252 A | 12/2000 | Compton et al. .............. 330/10 |
| 6,164,409 A | 12/2000 | Berger ......................... 181/135 |
| 6,167,141 A | 12/2000 | Yoest .......................... 381/322 |
| 6,456,720 B1 | * 9/2002 | Brimhall et al. ............ 381/324 |

FOREIGN PATENT DOCUMENTS

| | | | |
|---|---|---|---|
| JP | 5-88194 | 4/1993 | |
| JP | 5-335714 | 12/1993 | |
| JP | 6-334098 | 12/1994 | |
| JP | 6-338585 | 12/1994 | |
| JP | 8-172176 | 7/1996 | ........... H01L/23/50 |
| JP | 8-307777 | 11/1996 | ........... H01L/27/14 |

* cited by examiner

Primary Examiner—Huyen Le
(74) Attorney, Agent, or Firm—Schwegman, Lundberg, Woessner & Kluth, P.A.

(57) ABSTRACT

Hearing aids improve not only the hearing, but the lives of millions. Unfortunately, far too many sufferers of hearing loss forego the benefits of hearing aids because of size and cost of the devices. To address this need, the present inventor devised hearing-aid circuit modules that use folded flexible circuits. The modules save space and reduce the cost of manufacturing hearing aids.

15 Claims, 4 Drawing Sheets

HEARING-AID ASSEMBLY USING FOLDED FLEX CIRCUITS

RELATED APPLICATION

This application is a continuation of U.S. Provisional application No. 60/184,237 which was filed Feb. 23, 2000 and which is incorporated herein by reference.

TECHNICAL FIELD

The present invention concerns hearing aids, particularly hearing-aid assemblies and components.

BACKGROUND

For many, it is surprising to learn that one out of every ten Americans suffers from some form of hearing loss, ranking it the third most common disability in the United States, behind arthritis and high-blood pressure. Perhaps even more surprising is that half of those suffering hearing loss are under age 65.

Many hearing-loss sufferers enjoy considerable relief through use of electronic hearing aids. A multitude of advancements ranging from basic miniaturization and microphone and amplifier improvements to digital sound filtering and custom programmability have made it possible for hearing aids to improve the hearing of over 90% of hearing-loss sufferers. Unfortunately, even with these advances, many miss out on the benefits of these miraculous devices because of concerns regarding visibility or cost of the device.

A key factor in both the visibility and cost of hearing aids is still their size. Smaller hearing aids are generally less visible than larger devices, but more difficult and costly to manufacture. Moreover, even where cost is of less concern, manufacturers often have to increase hearing-aid size to provide all the circuitry needed to address some severe forms of hearing loss, ultimately forcing some sufferers to choose between better hearing or less visible hearing aids.

Accordingly, there continues to be a need for smaller hearing aids, particularly hearing-aid circuit assemblies that allow for more cost- and space-effective manufacture.

SUMMARY OF THE INVENTION

To address this and other needs, the present inventor devised a unique hearing-aid assembly concept that saves space and facilitates manufacture of hearing aids. One exemplary hearing-aid embodiment includes at least a portion of a hearing-aid housing or earshell containing a unique flex circuit coupled to a microphone and a receiver. The flexible circuit includes at least first, second, and third unfolded regions and a first folded region between the first and second unfolded regions and a second folded region between the second and third unfolded regions. One or more of the unfolded regions include input-output connections to electrical conductors within and/or on the flex circuit, and to a signal processor and supporting resistive and/or reactive components, such as capacitors.

Other aspects of the invention include methods of manufacturing hearing aids and intermediate hearing-aid assemblies. One exemplary intermediate assembly includes a formable plastic disk comprising an integral plastic container containing the exemplary flex circuit (described above.) Mounted to the surface of the disk are a microphone and a receiver which are electrically coupled to the flex circuit. The plastic disk portion of the assembly can be heated and shaped using conventional methods to form housing, or earshell, portion of a hearing aid.

DESCRIPTION OF EXEMPLARY EMBODIMENTS OF THE INVENTION

The following detailed description, which incorporates FIGS. 1–5, describes and illustrates one or more exemplary embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

U.S. Pat. No. 6,014,320, entitled High Density Stacked Circuit Module, is incorporated herein by reference.

Figure 1:
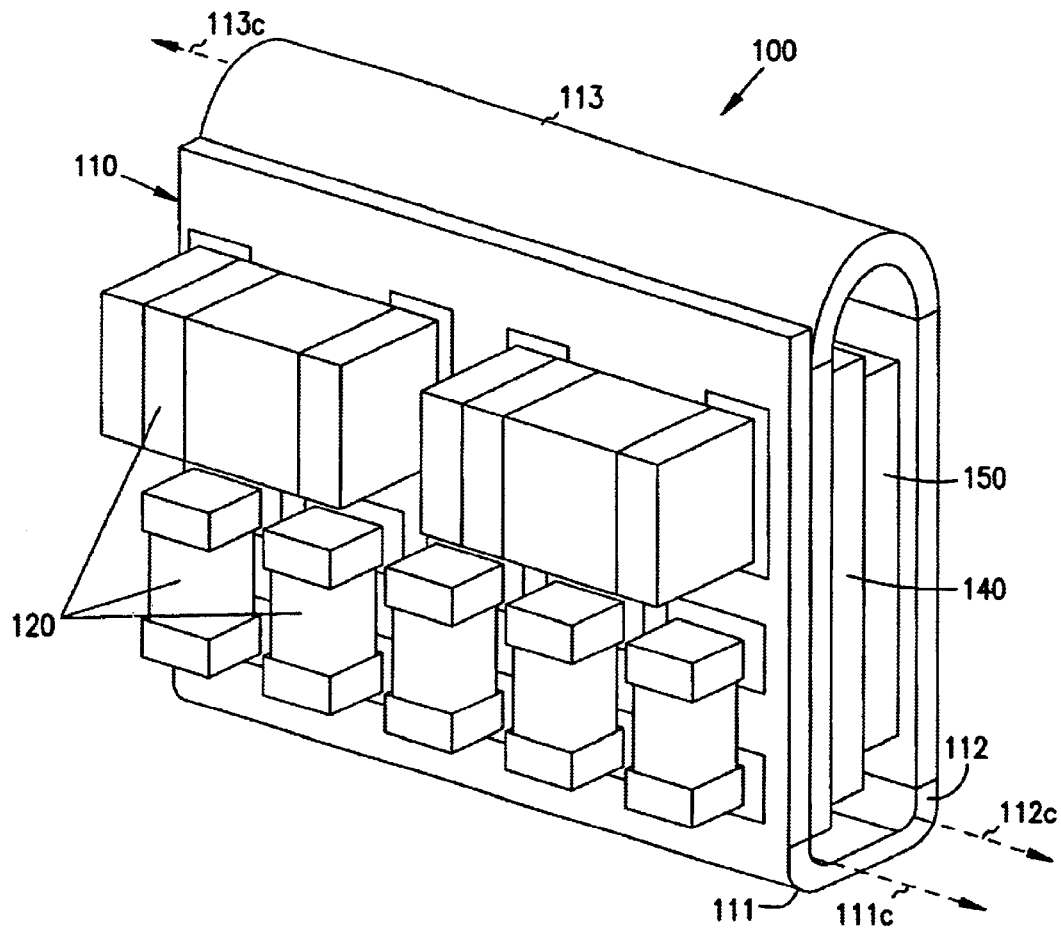
FIG. 1 is a top perspective view of an exemplary flex circuit module 100 incorporating teachings of the present invention.
Figure 2:
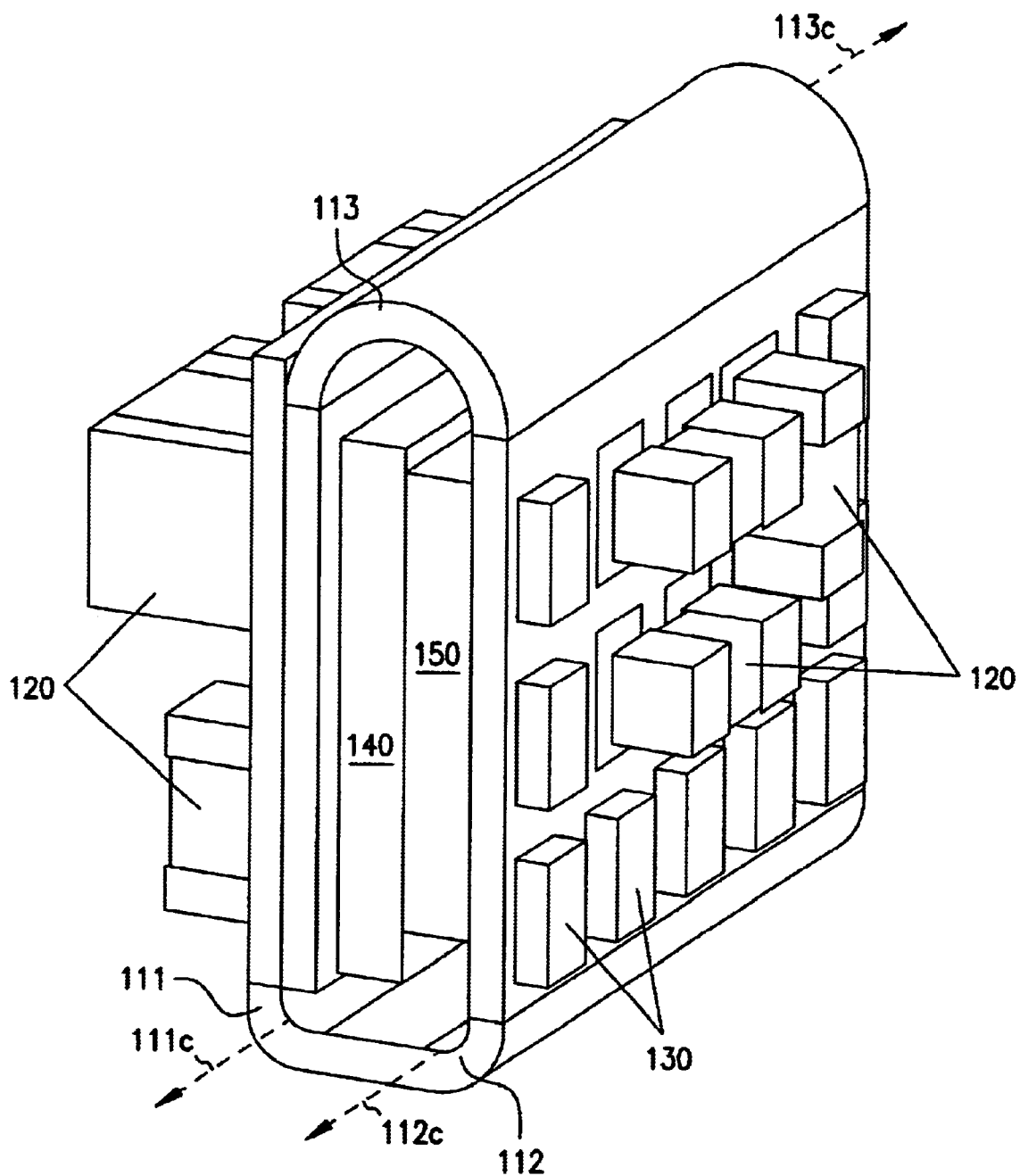
FIG. 2 is a bottom perspective view of flex circuit module 100 in FIG. 1.
Figure 3:
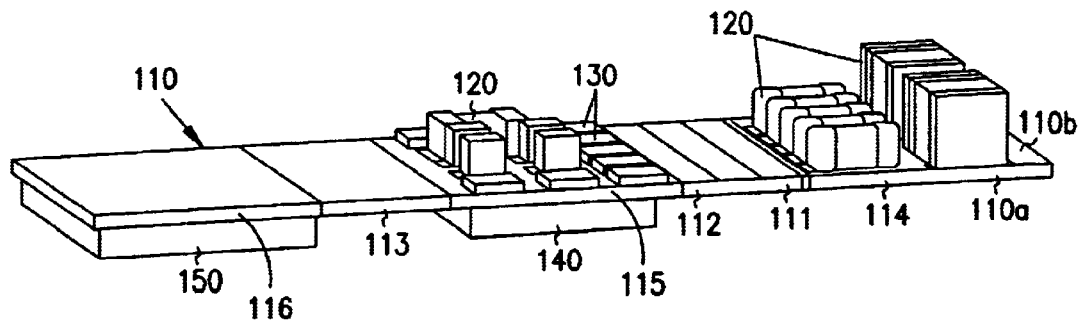
FIG. 3 is a perspective view of flex circuit module 100 in a partially disassembled state.

FIGS. 1 and 2 show respective top and bottom perspective views of an exemplary circuit module 100, and FIG. 3 shows a partially disassembled perspective view of module 100. Module 100 includes a flex circuit 110, components 120, input-output pads 130, and component groups 140 and 150.

More particularly, flex circuit 110 includes folded (or more generally foldable or flexible) regions 111, 112, and 113, and three non-folded or generally straight regions 114, 115, and 116. (In some embodiments, the entire length of flex circuit 110 is flexible, meaning that regions 114, 115, and 116 are also flexible.) Flex circuit 110 has respective top and bottom sides 110a and 110b, and each region of circuit 100 also has a top and bottom side. Thus, for example, folded region 111 includes a top side 111a and a bottom side 111b.

In some embodiments, one or more portions of the flex circuit includes a flexible base material and a conductive coating or cladding. Exemplary materials for the flexible base material include thermoplastic, thermoset, polyimide (PI), polyester (PIT), polyethylene naphthalate (PEN), flourinated ethylene-proplene coplymet (FEP), polyetherimide (PEI), aramiad, and epoxy. Exemplary material forms used in some embodiments of the invention include copper-clad flexible laminates, coverlayers, photoimageable coverlayers, covercoats, and bondplies. Exemplary conductive coating or cladding materials includes copper foil, electrodeposited copper (standard and heat treated), rolled and anneal copper, specialty copper alloys, electroplated copper, sputtered or vapor deposited copper, beryllium copper, aluminum foil, iron alloy, or polymer thick film (PTF). Some embodiments use built-in resistor-material flexible circuits, platable toner flexible circuits, and/or indium-tin oxide (ITO) flexible circuits. The invention, however, is not limited to any type or composition of flexible circuit.

In the exemplary embodiment, folded regions 111, 112, and 113 have respective fold axes or lines 111c, 112c, and 113c which are generally parallel to each other and perpendicular to the length dimension of the flex circuit. However, in other embodiments, two or more of the fold lines are substantially perpendicular to each other. In some embodiments, two or more of the fold lines are more generally not parallel. In still other embodiments, one or more of the fold lines are parallel to or skewed relative the length dimension of the flex circuit.

Some embodiments with two or more non-parallel folds have I-, L-, T-, or V-shaped pre-folded configuration. For example, with the L-shaped configuration, an upper portion of the top leg of the L is folded over a lower portion of the top leg, and the bottom leg of the L is folded over or under or up or down relative the folded portions of the top leg of the L. Depending on the length of the L and desired uses of the resulting module, multiple fold-overs, fold-unders, and/or 90-degree folds are used. The legs of the L can be physically discontinuous flex circuits.

Components 120 include one or more resistors, capacitors, inductors, transistors, jumpers, switches, circuit boards, or integrated circuits. Components 120 are electrically coupled in conventional ways to one or more conductors in flex circuit 110, specifically regions 114 and 115. Although the exemplary embodiment places components 120 on the bottom of flex circuit 110, other embodiments place all or a portion of the components on the top of the flex circuit. Still other embodiments distribute the components along a greater length of the flex circuit than does the exemplary embodiment. For example, some embodiments even place components on folded regions 111, 112, or 113.

Input-output pads 130 are mounted on the bottom side of region 115. In the exemplary embodiment, pads 130 form a C-shaped arrangement around the components mounted to region 115. However, the invention is not limited to any particular arrangement of pads. For example, other embodiments fully encircle the components with pads, mount pads along the full length of the flex circuit, including on one or more of regions 111, 112, or 113, and/or mount pads on one or both sides of any region of the flex circuit. The exemplary embodiment uses solder pads or solder balls, or ball-grid-array technology. However, the invention is amenable to virtually any form of input-output connection.

Components 140 and 150 are mounted using conventional techniques to respective regions 115 and 116. Components 140 and 150, which include one or more resistors, capacitors, inductors, transistors, jumpers, switches, circuit boards, or integrated circuits, are electrically coupled in conventional ways to one or more conductors in regions 115 and 116. The exemplary embodiments mounts components 140 and 150 such that the top sides of the components 140 confront the top sides of components 150 as shown in FIGS. 2 and 3.

In the exemplary embodiment, all of components 140 and all of components 150 are integrated into respective integrated circuits packages, for example, flip-chip packages, or circuit boards or other circuit-bearing substrates designed to form specific functions. In one embodiment, the flip-chip includes hearing-aid circuitry, such as a digital and/or analog signal processor which facilitate a hearing aid function. In some embodiments, one of components 140 and 150 is a heat sink, and in others a heat sink or more generally some form of heat-distribution member or agent sandwiched between components 150 and 160 upon final assembly.

Figure 4:
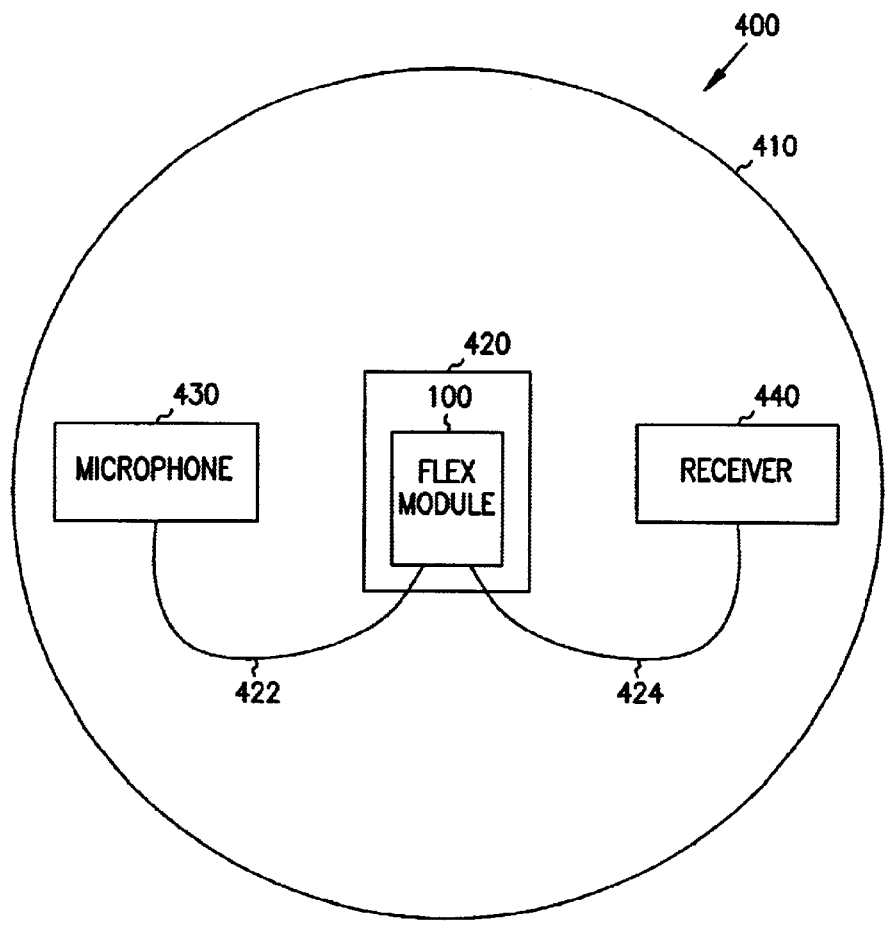
FIG. 4 is a diagrammatic view of an exemplary hearing-aid assembly 400 incorporating flex circuit module 100.

FIG. 4 shows an exemplary hearing-aid assembly 400 incorporating circuit module 100. Assembly 400 additionally includes a deformable disk 410, a deformable container 420, a microphone 430, a receiver 440, and wires 422 and 424. Deformable disk 410, which for example comprises plastic or foam, constitutes the material for forming a housing or earshell of a hearing aid. Container 420, which is integral to disk 410 in the exemplary embodiment, has a similar composition to disk 410 and provides a protective enclosure for flex circuit module 100, which is coupled respectively via wires 422 and 424 to microphone 430 and receiver 440. Though not visible in this view, container 420 includes an opening on its bottom side for receiving a battery which is coupled to battery terminals that are in turn coupled to flex module 100. Microphone 430 and receiver 440 are fastened to disk 410 using glue, tape, or other readily available means, to hold them in place during shipment and/or during subsequent deformation that transforms the disk into an earshell or hearing-aid housing.

Figure 5:
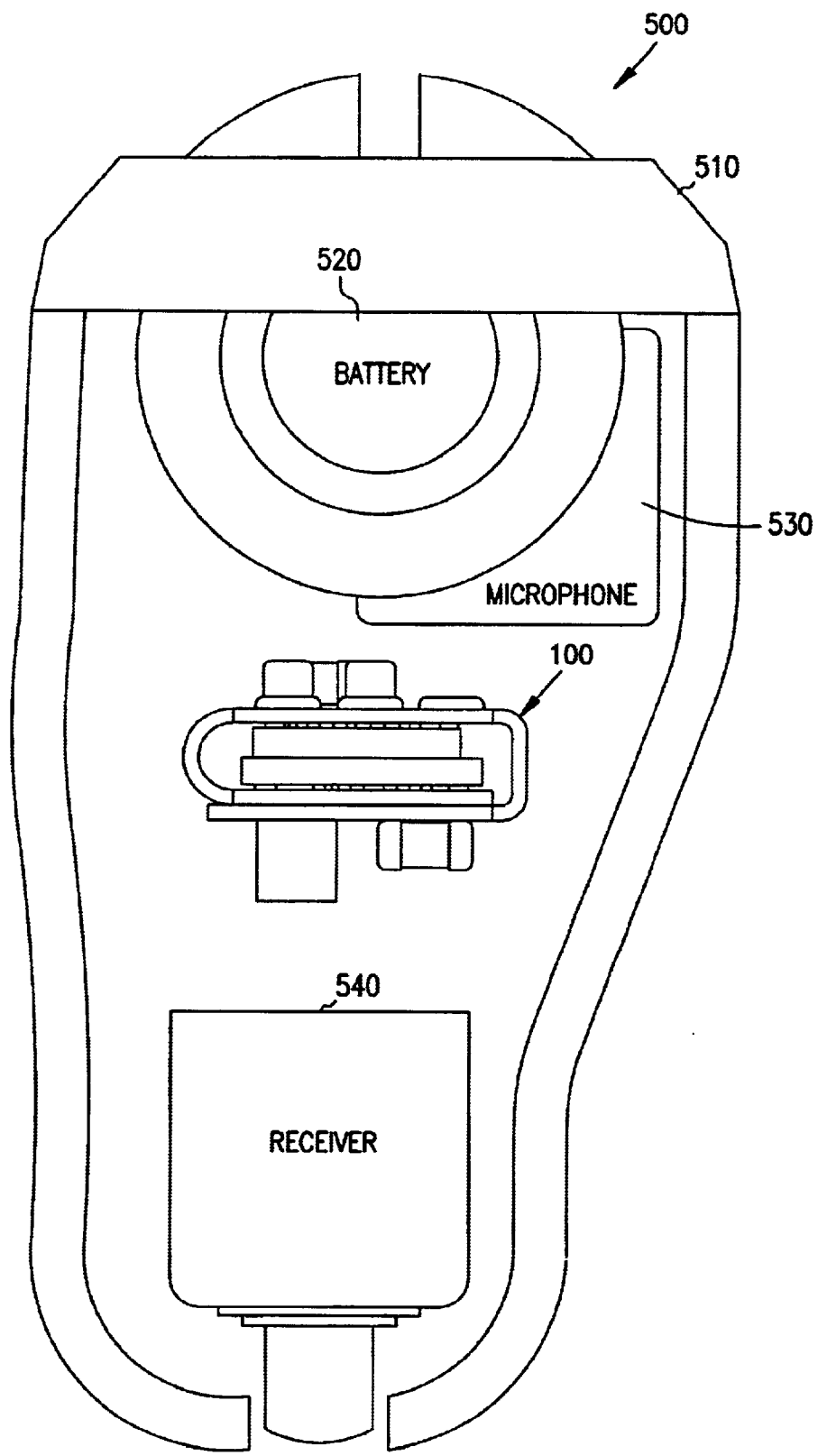
FIG. 5 is a simplified cross-sectional view of an exemplary hearing aid 500 incorporating flex circuit module 100.

FIG. 5 shows an exemplary hearing aid 500 incorporating flex circuit module 100. In addition, hearing aid 500 includes an earshell or housing 510, a battery 520, a microphone 530, and a receiver 530. The battery, microphone, and receiver are coupled to flex circuit module 100 (although for convenience the internal wiring is not shown.) Notably, module 100 includes two integrated circuit chips directly mounted to a flexible circuit.

Conclusion

In furtherance of the art, the inventor has presented a unique hearing-aid assemblies comprising folded flex circuits. One exemplary assembly includes a flex circuit having at least two folds. The folds not only facilitate ease of manufacture, but also save space.

The embodiments described above are intended only to illustrate and teach one or more ways of making and using the present invention, not to restrict its breadth or scope. The actual scope of the invention, which embraces all ways of practicing or implementing the teachings of the invention, is defined only by the following claims and their equivalents.

What is claimed is:

1. A hearing-aid assembly comprising:
   a deformable disk having a major surface;
   a container attached or mounted to the deformable disk;
   a flexible circuit module at least partially within the container and including:
      at least first, second, and third unfolded regions and a first folded region between the first and second unfolded regions and a second folded region between the second and third unfolded regions;
      one or more input-output connections mounted to one or more of the unfolded regions;
      first and second signal processing chips mounted to the first and second unfolded regions and electrically coupled to the one or more of the input-output connections;
   a microphone coupled to at least one of the input-output connections; and
   a receiver coupled to at least another one of the input-output connections.

2. The hearing-aid assembly of claim 1, wherein the microphone and the receiver are mounted to the disk.

3. The hearing-aid assembly of claim 1, wherein the disk consist essentially of plastic.

4. The hearing-aid assembly of claim 1, wherein the container is integral to the disk.

5. The hearing-aid assembly of claim 1, wherein at least the first and second unfolded regions and the first folded region are formed from two or more mechanically discontinuous sections of flexible circuit.

6. The hearing-aid assembly of claim 1, wherein the one or more electrical components include first and second integrated circuits, with the first integrated circuit mounted on a top surface of the second region and the second integrated circuit mounted on a top surface of the third region such that the first and second integrated circuits are back to back.

7. The hearing-aid assembly of claim 1, wherein the deformable disk is for use in forming an earshell for an in-the-ear hearing aid.

8. A hearing-aid assembly comprising:
a deformable material structure for use in forming an earshell for a hearing aid;
a flexible circuit module positioned on the deformable material structure and including:
at least first, second, and third unfolded regions and a first folded region between the first and second unfolded regions and a second folded region between the second and third unfolded regions;
one or more input-output connections mounted to one or more of the unfolded regions;
first and second components mounted to the first and second unfolded regions and electrically coupled to the one or more of the input-output connections;
a microphone coupled to at least one of the input-output connections; and
a receiver coupled to at least another one of the input-output connections,
wherein the deformable material structure includes an integral container for the flexible circuit module.

9. The hearing-aid assembly of claim 8, wherein the microphone and the receiver are mounted to the deformable material structure.

10. The hearing-aid assembly of claim 8, wherein the deformable material structure consists essentially of plastic.

11. The hearing-aid assembly of claim 8, wherein at least the first and second unfolded regions and the first folded region are formed from two or more mechanically discontinuous sections of flexible circuit.

12. The hearing-aid assembly of claim 8, wherein the first component includes an integrated circuit and the second component includes an integrated circuit.

13. The hearing-aid assembly of claim 8, wherein the first component includes an integrated circuit and the second component includes a heat sink.

14. The hearing-aid assembly of claim 8, wherein the first and second fold regions are substantially parallel with each other.

15. The hearing-aid assembly of claim 8, wherein the deformable structure is for use in forming an earshell for an in-the-ear hearing aid.

* * * * *